United States Patent
Corbet et al.

(10) Patent No.: US 12,166,340 B2
(45) Date of Patent: Dec. 10, 2024

(54) METHOD AND SYSTEM FOR DETECTING FAULTS IN A LOW VOLTAGE THREE-PHASE NETWORK

(71) Applicant: Schneider Electric Industries SAS, Rueil Malmaison (FR)

(72) Inventors: David Corbet, Vizille (FR); Philippe Alibert, Lans en Vercors (FR); Thi Thu Ha Pham, Gieres (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 473 days.

(21) Appl. No.: 17/533,173

(22) Filed: Nov. 23, 2021

(65) Prior Publication Data

US 2022/0181865 A1  Jun. 9, 2022

(30) Foreign Application Priority Data

Dec. 3, 2020 (EP) .................................... 20306493

(51) Int. Cl.
*G01R 31/58* (2020.01)
*H02H 1/00* (2006.01)
(Continued)

(52) U.S. Cl.
CPC .......... *H02H 1/0092* (2013.01); *G01R 31/58* (2020.01); *H02H 3/04* (2013.01); *H02H 3/081* (2013.01); *H02H 3/083* (2013.01)

(58) Field of Classification Search
CPC ............ G01R 31/50–59; G01R 31/083; G01R 19/16566; G01R 25/00; G08B 21/182;
(Continued)

(56) References Cited

U.S. PATENT DOCUMENTS 5,309,312 A * 5/1994 Wilkerson ............... H02H 3/38
361/79
5,572,138 A 11/1996 Nimmersjö
(Continued)

FOREIGN PATENT DOCUMENTS

CN 111983381 A * 11/2020 ........... G01R 31/085
EP 0971471 A2 1/2000

OTHER PUBLICATIONS

Horak, Directional Overcurrent Relaying (67) Concepts, https://www.myprotectionguide.com/uploads/7/3/0/1/73017921/directionaloc.pdf ). (Year: 2017).*
(Continued)

*Primary Examiner* — Lee E Rodak
*Assistant Examiner* — Demetrius R Pretlow
(74) *Attorney, Agent, or Firm* — Locke Lord LLP

(57) ABSTRACT

A method for detecting faults in a low voltage three-phase network including:
checking if any of three phases of the three-phase network satisfies first conditions for a predetermined duration of time;
if at least two phases satisfy the first conditions, detecting an inter-phase fault by checking if the current level in at least two phases exceed a threshold and if the corresponding current flows are in the same direction;
if only one of the three phases satisfies the first conditions, for the phase which has satisfied the first conditions, checking if a second condition is satisfied and, in a positive case, detecting a mono-phase fault.

10 Claims, 9 Drawing Sheets

(51) Int. Cl.
*H02H 3/04* (2006.01)
*H02H 3/08* (2006.01)

(58) Field of Classification Search
CPC ...... H02H 1/0092; H02H 1/0007; H02H 3/04;
H02H 3/081; H02H 3/083; H02H 3/38
See application file for complete search history.

(56) References Cited

U.S. PATENT DOCUMENTS

2003/0206022 A1* 11/2003 Ying ................... G01R 19/14
324/526
2007/0085549 A1 4/2007 Fischer
2014/0266272 A1* 9/2014 Beck ................... H02H 3/335
324/750.3
2017/0358919 A1 12/2017 Smith et al.

OTHER PUBLICATIONS

Extended European Search Report and Search Opinion dated May 21, 2021 for corresponding European Patent Application No. 20306493.6, 7 pages.

* cited by examiner

2b: direction BUSBAR/Reverse
2a: direction Line/forward

METHOD AND SYSTEM FOR DETECTING FAULTS IN A LOW VOLTAGE THREE-PHASE NETWORK

TECHNICAL FIELD

The present invention relates to a method and a system for detecting faults in a low voltage three-phase network.

BACKGROUND

A directional overcurrent protection (or system) placed on an electric line consists of two components: an overcurrent component and a directional component. These two components operate jointly for determining a current magnitude (the overcurrent component) and a direction of current (the directional component) flowing on the line.

The directional overcurrent protection activates a switching or breaking device (for example a circuit breaker, a switch disconnector) placed on the line, when the current is flowing into a preset direction and its magnitude exceeds a preset threshold for a specific duration. The switching or breaking device is an automatically operated electrical switch arranged to protect an electrical circuit from damage caused by excess current from an overload or short circuit. When the circuit breaker receives a triggering command from the directional overcurrent device, it interrupts the current flow on the line, because a fault has been detected.

In a directional overcurrent device, the overcurrent component determines the current magnitude in a manner known per se, while the directional component, to determine the direction of the current, uses the evolution of a phase angle between the current and a reference voltage.

There are known different voltages to be used as reference voltage, for example quadrature phase-to-phase voltages ($U_{BC}$ vs. $I_A$, $U_{CA}$ vs. $I_B$, and $U_{AB}$ vs. $I_C$, where A, B and C denote the three phases of a three-phase system, and $U_{xy}$ denotes the voltage between an X and an Y phase), or sequence components such as positive-sequence ($V_1$ vs. $I_1$, where $V_1$ and $I_1$ are respectively the positive-sequence voltage and current), negative-sequence ($V_2$ vs. $I_2$) and zero-sequence ($V_0$ vs. $I_0$).

The reference voltage, also called voltage polarization signal, may be rotated to properly align forward and reverse direction zones of the directional overcurrent device. This rotation angle is referred to as characteristic angle, also called maximum torque angle (MTA).

Two different directional overcurrent devices are known, a phase directional overcurrent protection (ANSI 67) for detection of phase-to-phase faults and a ground directional overcurrent protection (ANSI 67N or 67G) for detection of single phase faults (phase-to-ground and phase to neutral faults), in a three-phase network.

The ANSI 67 directional overcurrent protection uses a quadrature phase-to-phase voltage as reference voltage, while the zero-sequence voltage is used by ANSI 67N or ANSI 67G protections.

By design, there are some situations where ANSI 67 protection cannot always detect efficiently the direction of single phase faults, for the same reasons the ANSI 67N or ANSI 67G protections cannot detect efficiently the direction of phase-to-phase faults.

The directional overcurrent devices are necessary to guarantee selectivity in multisource networks, for example in case of supply through a plurality of transformers placed in parallel, or in case of connection of a production system to a network (co-generation).

In particular, in the context of evolution of low voltage networks applications towards multisource systems, smart grids and microgrids that need a plurality of sources in parallel (photovoltaic systems, batteries, distribution network) or Distributed Energy Resources (DER) integration, directional overcurrent devices are considered more and more as fundamental strategic components. Indeed, a directional overcurrent device is able to identify and disconnect, through the circuit breaker, only the faulty feeder of a network, whereas a basic overcurrent protection, without any directionality criterion, would disconnect at the same time, in case of fault, all power sources, thus leading to a blackout. The directional overcurrent device allows better localizing a fault to isolate only the portion of the network affected by the fault.

Most of high and medium voltage (HV and MV) applications have phase-to-phase and phase-to-ground directional overcurrent protections to detect the fault direction (forward or reverse), such as the above-mentioned ANSI 67 and ANSI 67N protection. The directional overcurrent devices above cited require current and voltage measurements and a measurement of the phase angle relationship between voltage and current to determine the fault direction.

On the contrary, low voltage circuit-breaker units are nowadays rarely equipped with voltage measurement systems, and the processing power is limited. Current-based directional algorithms have been studied, to determine the fault direction, but they have showed limited performance.

Consequently, there is currently no common directional protection in low voltage systems.

Furthermore, it is worth pointing out that the phase directional overcurrent protection ANSI 67 used in medium voltage applications is not stable with certain faults.

In order to activate an ANSI 67 protection, two criteria are used, based respectively on the magnitude of the current and on the direction of the current. The analysis is done independently on the three phases.

To determine the direction of the current on each phase, the ANSI 67 protection uses the angle (phase difference) between the current of the considered phase and the reference voltage. The most used voltage reference is the quadrature phase-to-phase voltage. For example, the reference voltage for the current of the phase A is the $U_{BC}$ voltage. In case of fault on the phase A, the voltage on the phase A decreases and cannot be used any more, but the $U_{BC}$ voltage has a sufficient magnitude to measure its phase with precision. The same technique is applied to the other B and C phases.

FIG. 1 is a circuital scheme of an ANSI 67 protection 2 placed to control a feeder 4 connected to a busbar 6 of a three-phases network. In particular, in FIG. 1, two ANSI 67 protections 2a, 2b are shown, each representing a protection for protecting respectively in a forward and a reverse direction, as here explained. The ANSI 67 protection 2 can be oriented to perform a feeder (or forward) protection, by activating a circuit breaker in case of overcurrent towards the direction of the feeder 4, or a busbar (or reverse) protection, by activating a circuit breaker in case of overcurrent towards the direction of the busbar 6 of the three-phase network.

FIG. 2 is schematic picture showing how an ANSI 67 device determines the direction of the current in a phase of the three-phases network. The same logic can be applied to the other three phases, even using a different polarization voltage.

On a plane, a reference voltage vector, for example a $U_{BC}$ vector, represents a reference voltage $U_{BC}$ between a phase B and a phase C of a three-phases system. A characteristic angle α, for example 45°, is applied on the reference voltage vector $U_{BC}$, and a first line 8 is obtained, this line being usually known as "MTA" (Maximum Torque Angle). Then, a perpendicular line 10 is drawn, this perpendicular line 10 defining a first zone 12 corresponding to line/forward direction of the current and a second zone 14 corresponding to a busbar/reverse direction of the current.

The position of a current vector $I_A$ representing the current flowing in a phase A, in either the first zone 12 or in the second zone 14, indicates the direction of the fault relative to the phase A.

An internal circle 16 represents a current threshold Is that the current has to exceed in order to detect the fault.

The above-disclosed procedure fails to detect the fault direction in some cases of resistive or unbalanced phase-to-phase faults. In the ANSI 67 protection, if the current level of the three phases exceed the threshold Is and two current flows are detected in a correct direction, while the third one is detected in the opposite direction, an inopportune trigger of the circuit breaker can be generated, with associated selectivity problems.

A remedy solution used in medium voltage applications is to apply the "two out of three" rule, i.e., a trigger for the circuit breaker is validated by the ANSI 67 protection only if the current level in at least two phases exceed the threshold Is, and if the corresponding current flows are in the same direction.

The application of the "two out of three" rule is therefore necessary to guarantee the stability of the protection.

However, applying this rule implies that a single phase-to-neutral or phase-to-ground fault cannot be detected.

In particular, if this rule is applied in low voltage applications, the directional overcurrent protection is not sensitive to mono-phase faults (phase-to-neutral or phase-to-ground) where only one current level exceeds the threshold Is. These faults are the most frequent ones in low voltage applications.

In medium voltage applications, a specific protection is performed to detect the mono-phase faults, with the ANSI 67N protection.

However, it is not possible to apply in low voltage applications an additional ground directional overcurrent protection ANSI 67N, because it would be too expensive, too complex to use and adjust (the technicians operating on low voltage systems do not usually know the advanced protections typical of medium or high voltage systems) and it would require too much calculating performances, not suitable for the control unit of low voltage circuit breakers.

SUMMARY

The object of the present invention is therefore to provide a method for detecting faults in a low voltage three-phase network, so as to detect any fault, in particular phase-to-phase faults, phase-to-neutral faults and phase-to-ground faults.

Furthermore, an object of the present invention is to provide a phase directional overcurrent system for detecting faults in a low voltage three-phase network to detect any short-circuit fault.

To that end, an aspect of the invention relates to a method for detecting faults in a low voltage three-phase network comprising the steps of:
  checking if any of three phases of the three-phase network satisfies first conditions for a predetermined duration of time;
  if at least two phases satisfy the first conditions, detecting an inter-phase fault by checking if the current level in at least two phases exceed a threshold and if the corresponding current flows are in the same direction;
  if only one of the three phases satisfies the above first conditions, for the phase which has satisfied the first conditions, checking if a second condition is satisfied and, in positive case, detecting a mono-phase fault.

In a first embodiment, the first conditions comprise checking if, for a predetermined time interval:
  the magnitude of the current in the phase exceeds a preset value;
  the direction of the current in the phase is in a preset direction.

In another embodiment, the second condition comprises checking if the following equations are satisfied:

$$Ma = \left( \frac{\sqrt{3} \cdot V_{AN}}{U_{BC}} < M_s \right)$$

$$Mb = \left( \frac{\sqrt{3} \cdot V_{BN}}{U_{CA}} < M_s \right)$$

$$Mc = \left( \frac{\sqrt{3} \cdot V_{CN}}{U_{AB}} < M_s \right)$$

wherein Ma, Mb, Mc refers to respective phases of the three-phases network, the signals $V_{AN}$, $V_{BN}$ and $V_{CN}$ are the phase-to-neutral voltages and Ms is a preset value.

In another embodiment, Ms is comprised between 0 and 1.

In another embodiment, to determine the direction of the current, the evolution of a phase angle between the current and a reference voltage is used.

In another embodiment, the reference voltage is a quadrature phase-to-phase voltage.

In another embodiment, the method comprises checking if the neutral of the network is accessible and, in positive case, generating an alarm signal.

In another embodiment, the invention relates to a phase directional overcurrent system comprising a control unit arranged to perform the method.

In another embodiment, the control unit is arranged to:
  determine three input signals representing current magnitude and direction, for each respective phase;
  if the first conditions are satisfied for any phase, put the corresponding input signal at the value 1, otherwise at the value 0;
  sending the input signal in parallel to a first mono-phase logic block and to an inter-phase logic block;
  if at least two input signals has a value equal to 1, output, from the first mono-phase logic block a first intermediate signal equal to 0 and detect an inter-phase fault;
  if any of the input signals a value equal to 1, output, from the first mono-phase logic block, a first intermediate signal equal to 1;
  if the first intermediate signal has a value equal to 1, send it to first AND logic blocks, together with the respective input signal and a respective ratio signals, said ratio signals corresponding to the second condition;
  depending on the input signal which has a value equal to 1, checking, through the corresponding first AND logic block, if also the respective ratio signal has a value equal to 1 and, in positive case, output a second intermediate signal with value equal to 1;

output, through a OR logic block, connected to the first AND logic blocks, a third intermediate signal having a value equal to 1 if one of the three second intermediate signals has value equal to 1;

checking, through a second AND logic block, if the third intermediate signal is equal to 1 and if a neutral signal is also equal to 1, said neutral signal indicating that the neutral is accessible, and in positive case, generating an alarm signal.

In another embodiment, when the at least two input signals has a value equal to 1, the inter-phase logic block applies a "two out of three" condition to detect an inter-phase fault and outputs an output signal representative of such inter-phase detected fault.

In another embodiment, the output signal is sent to an OR block together with the alarm signal.

BRIEF DESCRIPTION OF THE DRAWINGS

The invention will be further understood upon reading the following description, provided solely as a non-limiting example, and made in reference to the appended drawings, in which.

DETAILED DESCRIPTION OF SOME EMBODIMENTS

The method according to the present invention allows identification, by a single phase directional overcurrent protection, of a fault on a phase of a low voltage three-phase network, to send a triggering command to a circuit breaker placed on the faulty phase and connected to the phase directional overcurrent protection. The method allows detecting efficiently any phase-to-phase, phase-to-neutral and phase-to-ground fault.

The method is preferably performed by an ANSI 67 protection.

In a three-phase network, each phase A, B, C has an associated phase directional overcurrent protection. Therefore, the reference to the "single" phase directional overcurrent protection has to be interpreted as referring to each phase line.

According to the method of the present invention, a triggering command is sent in the following two cases:

if there are at least two currents flowing in respective phases into a preset direction and their magnitude exceeds a preset threshold over a preset duration of time;

if there is only one current that flows into a preset direction and its magnitude exceeds a preset threshold, and if the ratio of its phase-to-neutral voltage vs. its reference voltage drops below a preset threshold over a preset duration. Advantageously, a quadrature phase-to-phase reference voltage is used.

The presence of a fault on a phase is usually characterized by a drop of voltage on that phase, and a corresponding raise of the voltage on the unaffected phases. Thanks to the use of the ratio above cited it is possible to detect the faulty phase. By combining this information with the direction of the current, it is possible to stabilize the phase directional overcurrent protection and to trigger the circuit breaker only when it is necessary.

The method of the present invention can be applied in low voltage advanced protection units, i.e. having voltage measurement inputs, decentralized protection units or centralized control system with protection units.

Figure 3:
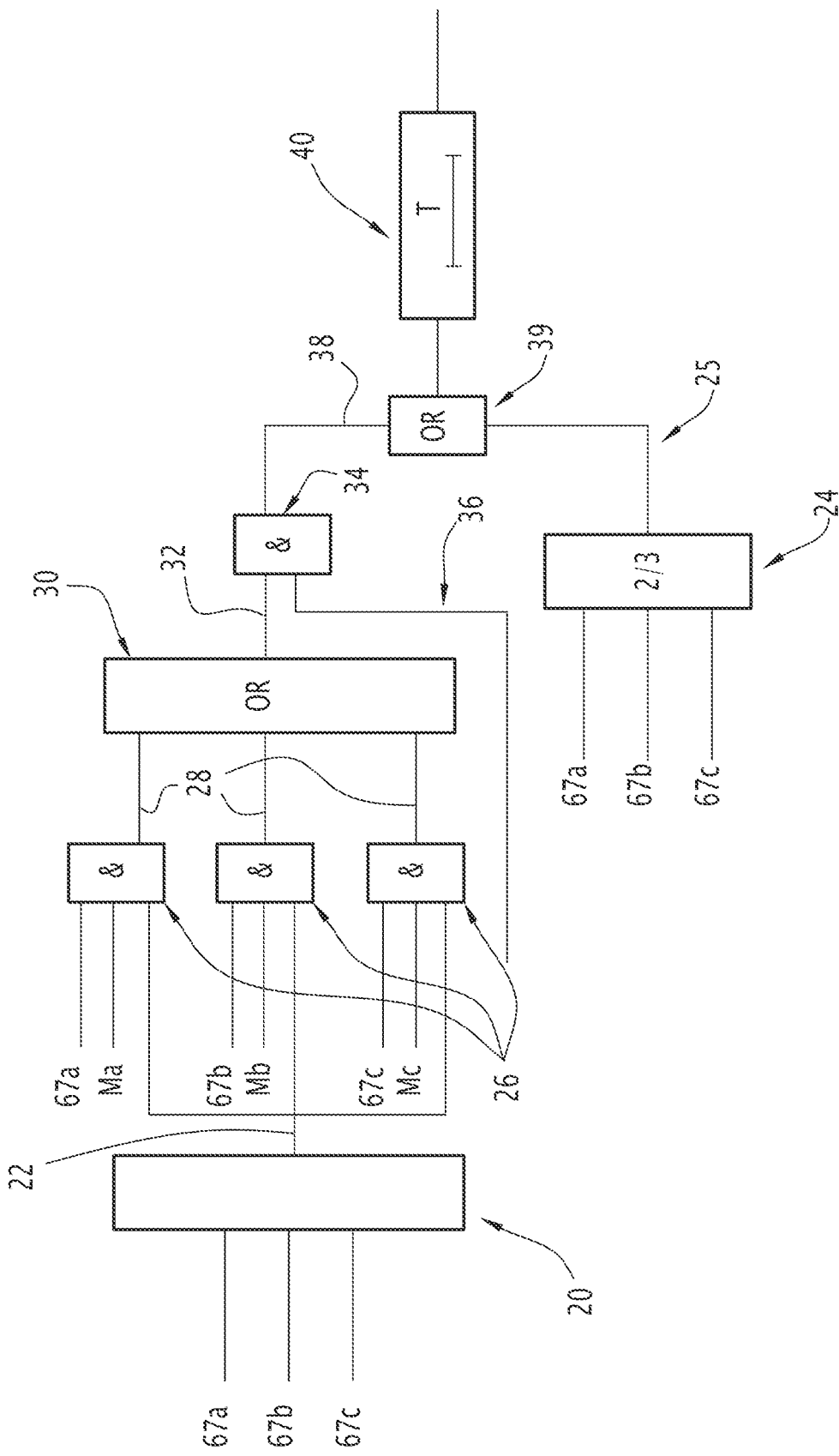
FIG. 3 shows a schematic logic circuit performing the method according to the present invention.

FIG. 3 shows a schematic logic circuit performing the method according to the present invention.

Advantageously, a phase directional overcurrent protection, such as an ANSI 67 protection, comprises a control unit arranged to implement such logic circuit.

In FIG. 3 three input signals 67a, 67b and 67c represent a directional detection result in a given direction (forward or reverse) obtained for a respective phase A, B or C. A directional detection result is the current magnitude and the current direction, for each phase A, B, C, obtained by the respective phase directional overcurrent protection.

For each phase A, B, C it is checked if the following first conditions are satisfied, for a predetermined duration of time.

The first conditions are:

the magnitude of the current in the analyzed phase exceeds a preset value;

the direction of the current in the analyzed phase is in a preset direction (forward or reverse). Advantageously, to determine the direction of current, the evolution of the phase angle between the current and a reference quadrature phase-phase voltage is used, e.g. $I_A$ vs. $U_{BC}$, $I_B$ vs. $U_{CA}$ and $I_C$ vs. $U_{AB}$.

If the first conditions are satisfied for any phase A, B, C, the corresponding input signal 67a, 67b, 67c gets the value of 1, otherwise the value is 0.

The input signal 67a, 67b, 67c are sent in parallel to a first logic block 20 and to second "two out of three" logic block 24.

The first logic block 20 outputs a first intermediate signal 22 equal to 1 if only one of the signals 67a, 67b or 67c has a value equal to 1.

If two or three input signals 67a, 67b, 67c has a value equal to 1, the first logic block 20 outputs a first intermediate signal 22 equal to 0 and the second "two out of three" logic block 24 applies a "two out of three" condition per se known to detect an inter-phase fault (a fault between two or three phases). The second "two out of three" logic block 24 output an output signal 25 representative of such inter-phase detected fault.

If the first intermediate signal 22 has value equal to 1, it is sent to first AND logic blocks 26. Each first AND logic block 26 receives in input the first intermediate signal 22, the respective input signal 67a, 67b, 67c and a respective ratio signals Ma, Mb and Mc. The ratio signals Ma, Mb, Mc can get a value equal to 0 or 1 depending on satisfaction of the following equations:

$$Ma = \left( \frac{\sqrt{3} \cdot V_{AN}}{U_{BC}} < M_s \right)$$

$$Mb = \left( \frac{\sqrt{3} \cdot V_{BN}}{U_{CA}} < M_s \right)$$

$$Mc = \left( \frac{\sqrt{3} \cdot V_{CN}}{U_{AB}} < M_s \right)$$

The signals $V_{AN}$, $V_{BN}$ and $V_{CN}$ are the phase-to-neutral voltages.

The ratio signals Ma, Mb and Mc represent a voltage criterion to validate a mono-phase fault.

The above equations represent a second condition that has to be satisfied in order to detect a mono-phase fault.

The value Ms is a preset threshold. The value of Ms is chosen to be able to distinguish a resistive fault from the natural unbalance of an healthy network, due to unbalanced load between phases, type of loads and electrical network characteristics.

The choice of Ms should consider both the natural unbalance rate of the network (magnitude of the voltages of each phase) and the sensitivity to the desired resistive faults.

If the threshold is set too high, there can be a risk of triggering of the circuit breaker due to unbalances of the network.

If the threshold is too low, there can be a risk of non-detection of extremely resistive faults.

Advantageously, Ms has a value comprised between 0 and 1, and preferably it is equal to 0,9, which is capable of guaranteeing the correct functioning of the method up to an unbalance of the voltages of the network equal 10%.

Depending on the input signal 67a, 67b or 67c which has a value equal to 1, the corresponding first AND logic block 26 checks if also the respective ratio signal Ma, Mb, Mc has a value equal to 1 and, in positive case, it outputs a second intermediate signal 28 with a value equal to 1.

A second mono-phase logic block 30, connected to the first AND logic blocks 26, outputs a third intermediate signal 32 having a value equal to 1 if only one of the three inputs (any of the second intermediate signals 28) has a value equal to 1.

The third intermediate signal having a value equal to 1 allows identifying a mono-phase fault (a fault on a phase), which is a fault on the phase whose second intermediate signal 28 has value equal to 1.

A second AND logic block 34 checks if the third intermediate signal 32 is equal to 1 and if a neutral signal 36 is equal to 1, this indicating that the neutral is accessible by a user. In positive case, an alarm signal 38 is generated.

The alarm signal 38 passes through an OR block 39, which is also connected to the output of the second "two out of three" logic block 24

A time delay can be added to the alarm signal 38 (or to the output signal 25), through a timer 40, before sending it to a remote control unit.

Figure 4:
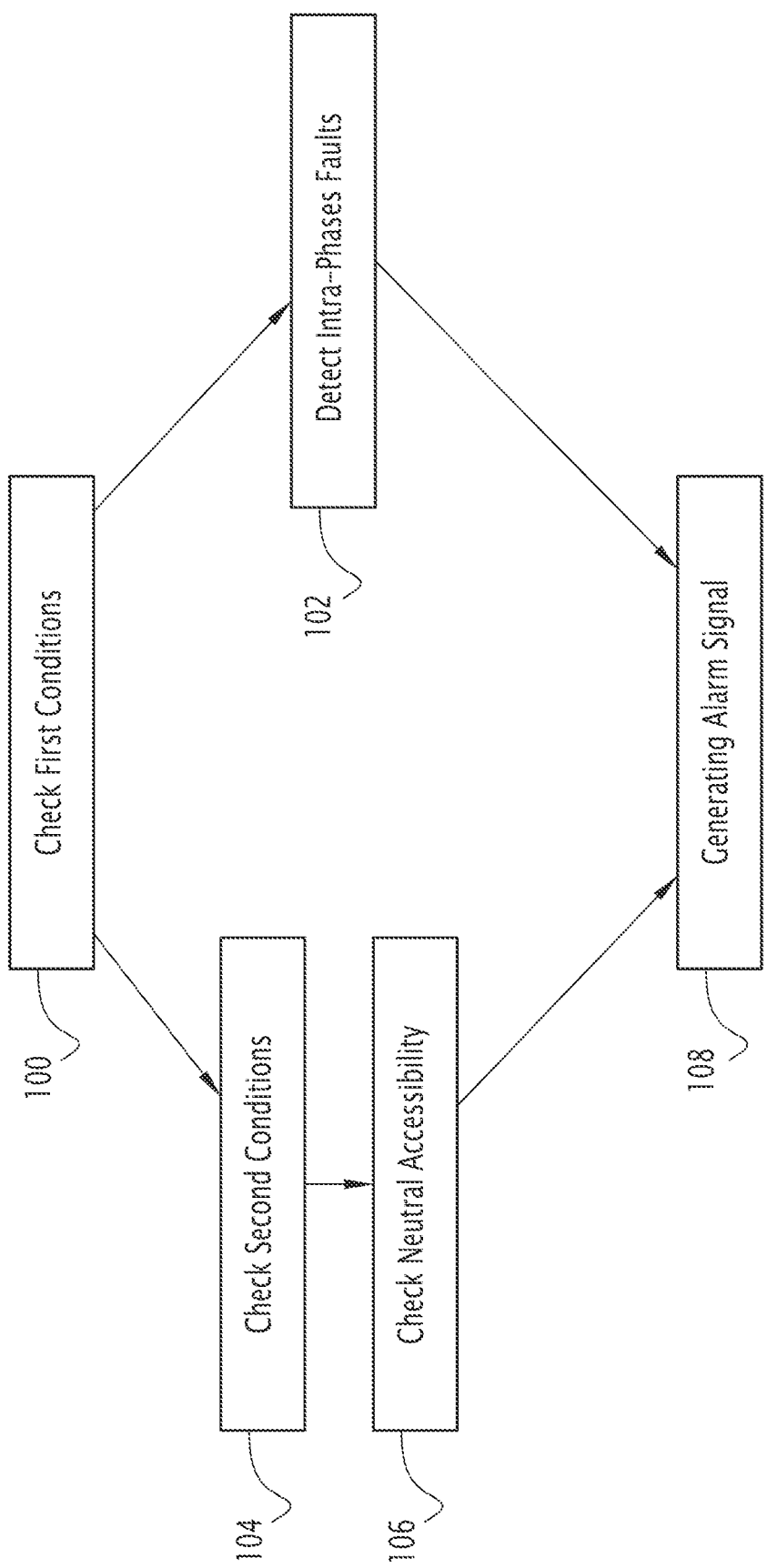
FIG. 4 is a block diagram of the steps of the method according to the present invention.

FIG. 4 is a block diagram of the steps of the method according to the present invention, based on the above disclosure of the logic circuit.

In a first step 100 of the method, it is checked if any of three phases A, B, C of a three-phase network satisfies the above first conditions.

If at least two phases satisfy the first conditions, in a step 102 a "two out of three" criterion is applied to detect an intra-phase fault.

If only one of the three phases A, B, C satisfies the above first conditions, in a step 104, for the phase which has satisfied the first conditions, it is checked if the second condition is satisfied.

In positive case, in a step 106 it is checked if the neutral of the network is accessible.

In positive case, in a step 108 an alarm signal is generated.

Figure 5:
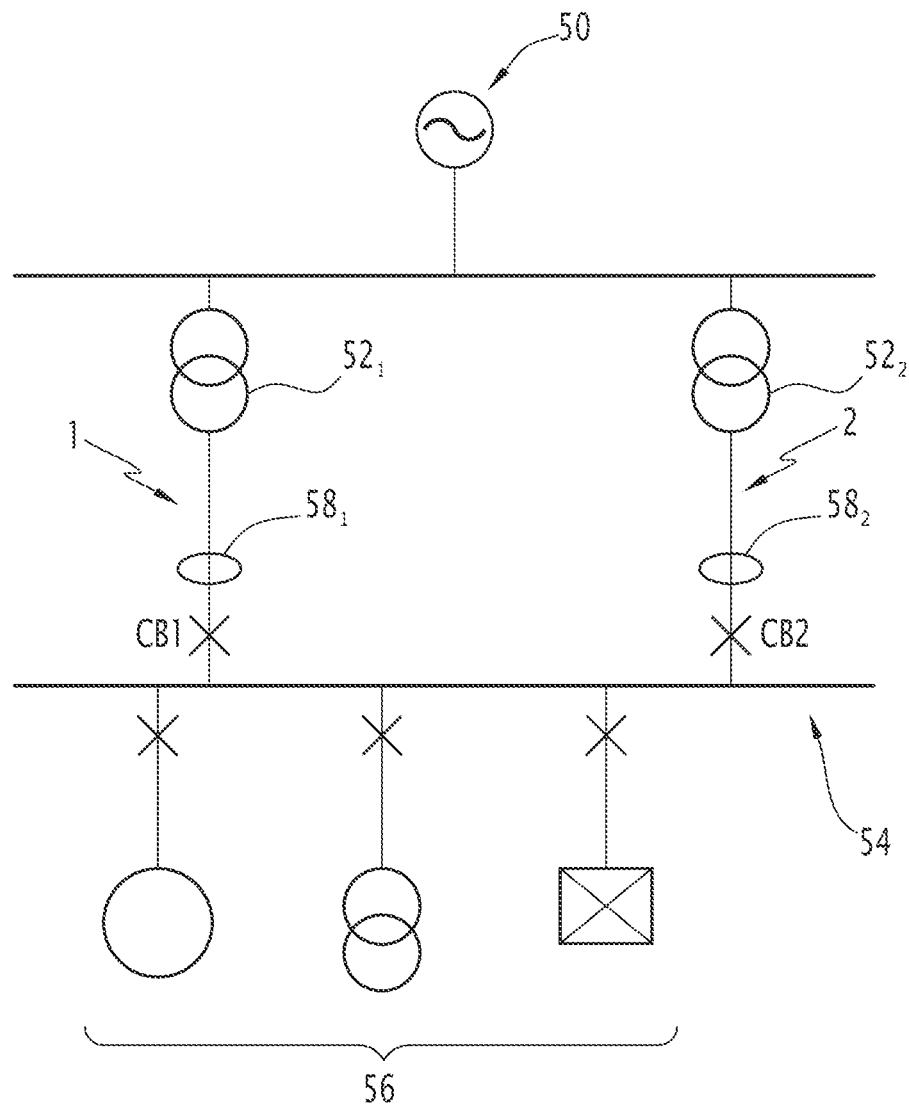
FIG. 5 shows a schematic circuit of an exemplary embodiment of the present invention.

FIG. 5 shows a schematic circuit of an exemplary embodiment of the present invention.

A 400V electrical network 50 is supplying two transformers $52_1$, $52_2$ in parallel. A low voltage network 54 is with solidly earthed neutral system. A plurality of loads are indicated with reference 56. Transformers incomer circuit breakers CB1 and CB2 are equipped with respective phase directional overcurrent protection $58_1$ and $58_2$, preferably ANSI 67 protections.

Figure 1:
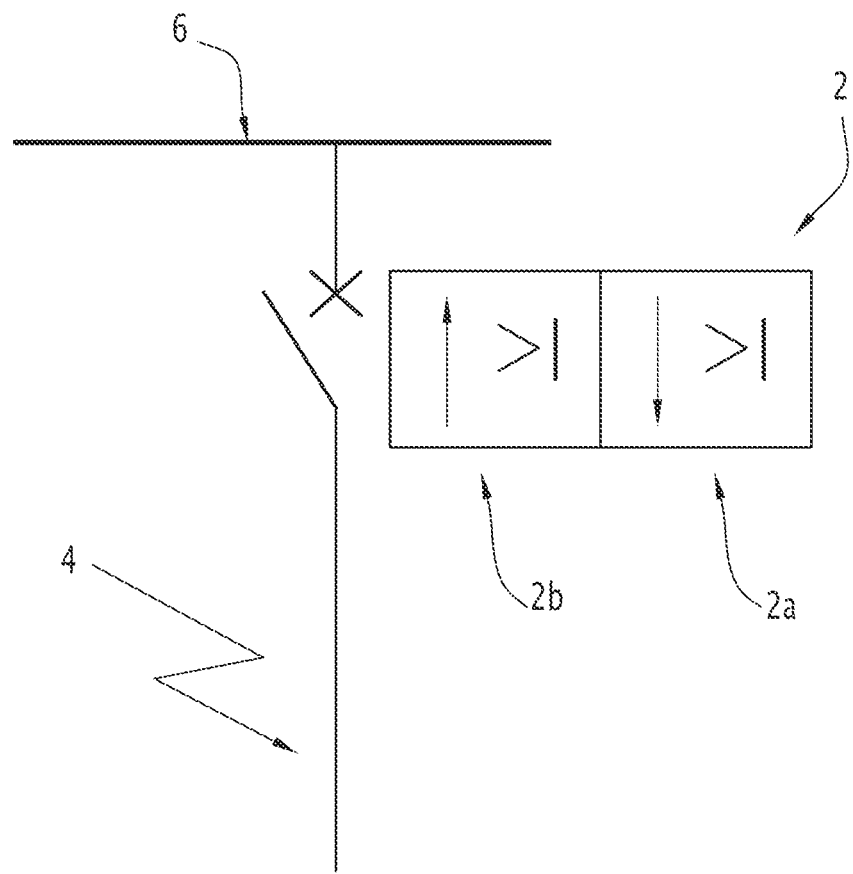
FIG. 1 is a circuital scheme of an ANSI 67 protection placed to control a feeder connected to a busbar of a three-phase network.
Figure 2:
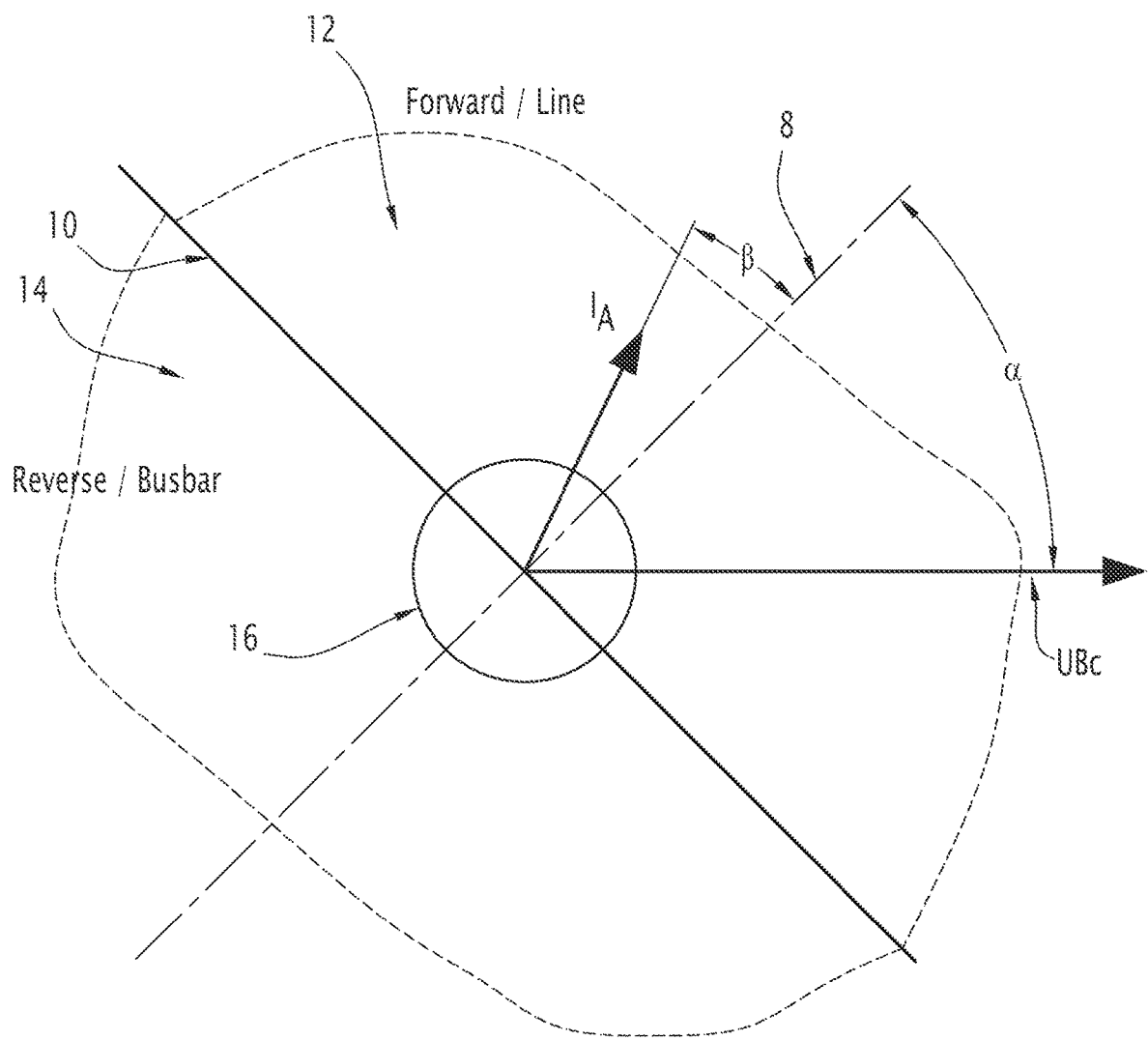
FIG. 2 is a schematic picture showing an example of how an ANSI 67 protection determines the direction of the current in phase A of a three-phase network.

The ANSI 67 protections $58_1$ and $58_2$ are set to send a triggering command in forward/line direction, for all faults between the transformers $52_1$, $52_2$ and the incomer circuit breakers CB1, CB2. The common settings are:

Current threshold Is=0.5*In where In is the circuit breaker rated current;
Tripping time is =0.1 s (or 0.2 s)
Fault direction is forward/line if the "phase angle" is between −90° and +90° anti-clockwise, fault direction is reverse/busbar if the "phase angle" is between +90° and +270° anti-clockwise, wherein "phase angle" refers to the angle β between the current $I_A$ and the MTA as shown in FIG. 2.

Validation tests have been performed considering faults at various points in the networks. All fault types (phase-to-ground, phase-to-neutral, phase-to-phase) with varying impedance and unbalanced load level have been considered.

Performance of the method according to the invention have been evaluated by analyzing two examples of fault at the first transformer $52_1$. It has been verified that the first transformer incomer circuit breakers CB1 triggers, while the second transformer incomer circuit breaker CB2 does not trigger.

Figure 6:
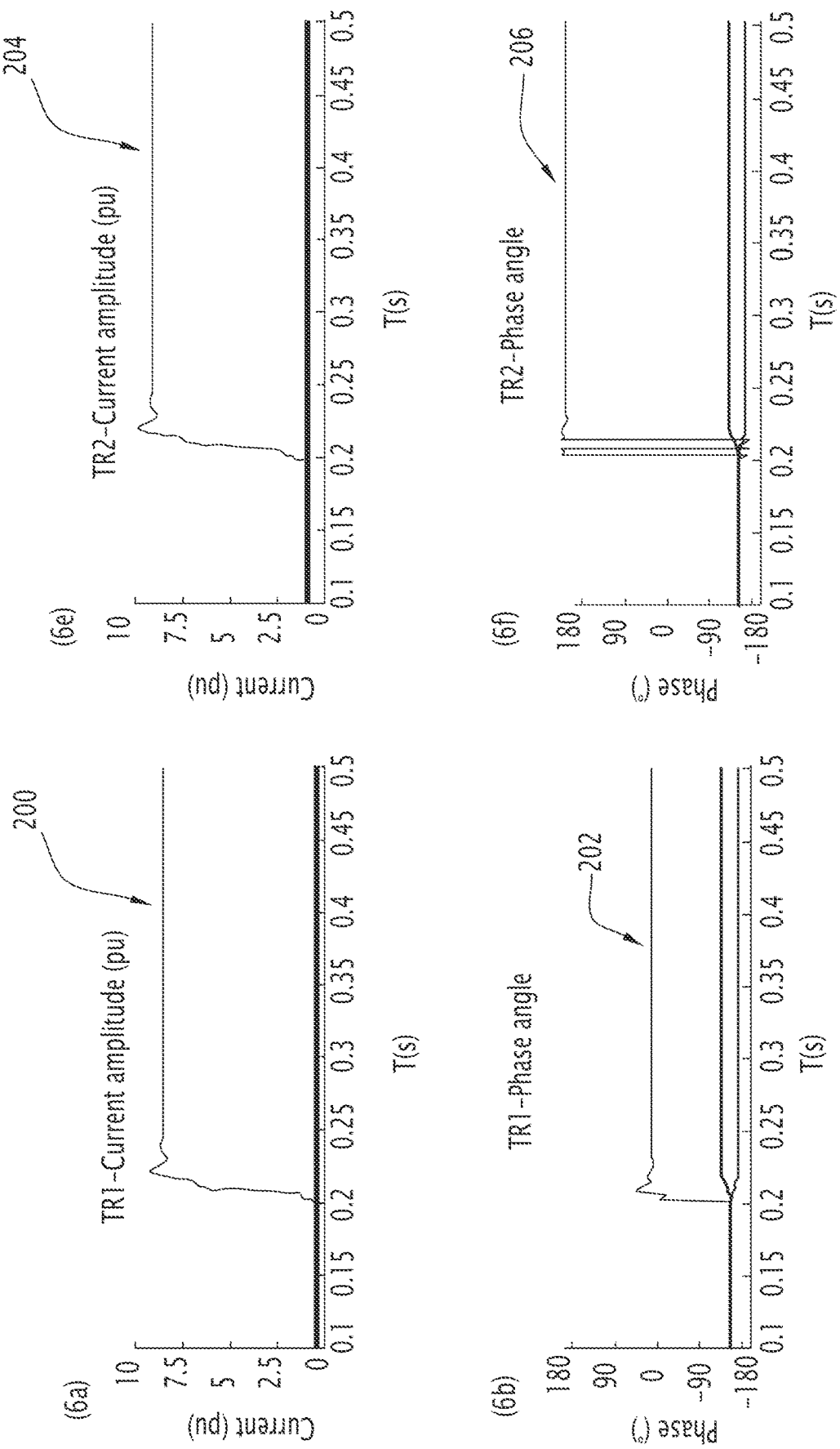
FIG. 6 shows graphs of the current, the phase, the input signals and the ratio signals of the circuit of FIG. 5 for two different faults at the first transformer.
Figure 6:
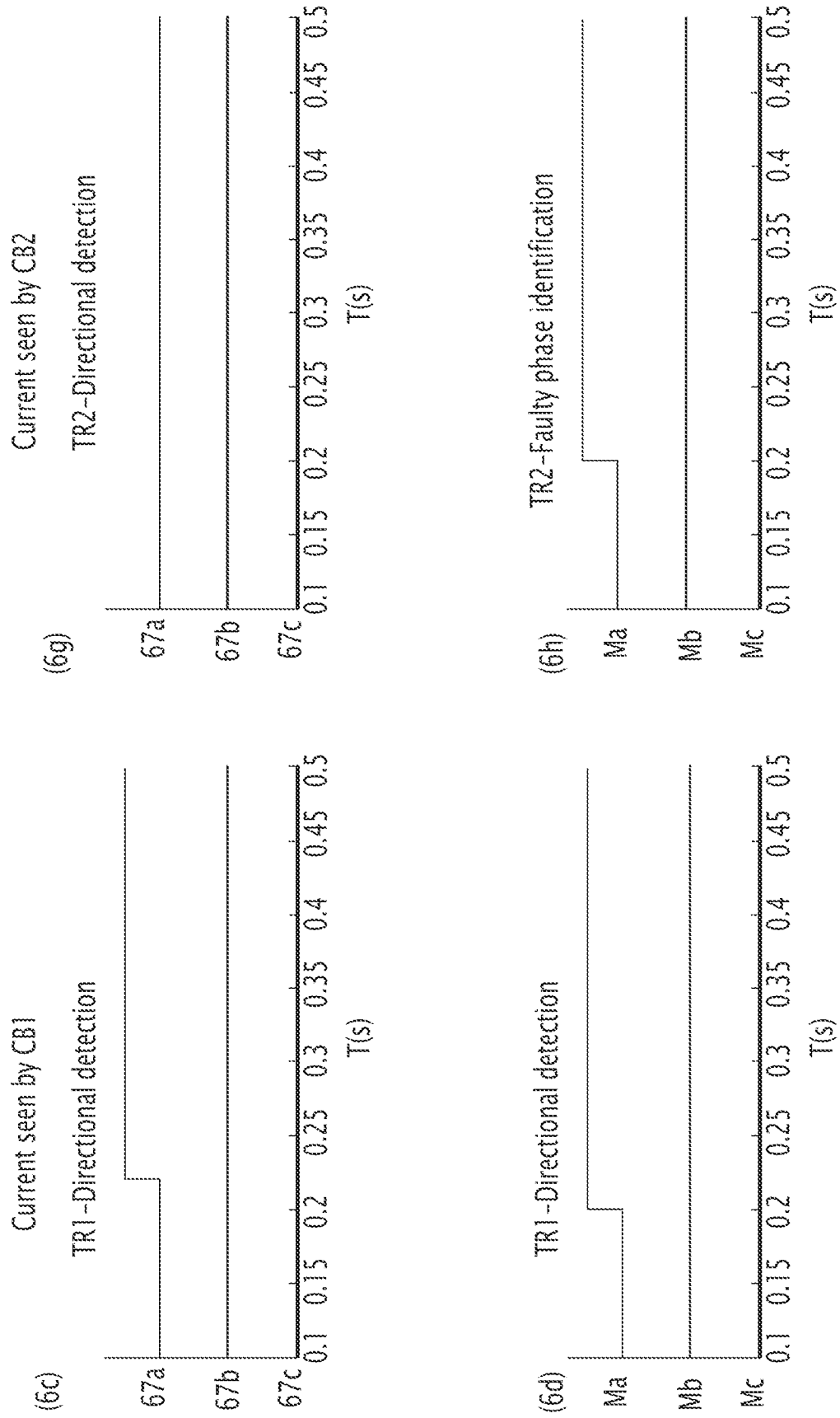

FIG. 6 shows graphs of the current magnitude, the phase angle, the input signals 67a, 67b, 67c and the ratio signals Ma, Mb, Mc of the circuit of FIG. 5 during the two examples of fault at the first transformer $52_1$ above disclosed.

For example, in case of a single phase to ground fault, as shown in FIG. 6, the first ANSI 67 protection $58_1$ detects a fault in phase A (67a at value 1 in graph 6(c)) as its current amplitude 200 exceeds a threshold and the phase angle 202 gets into forward direction. The Ma signal equal to 1 in graph 6(d) confirms that the phase A is the faulty phase, so the first transformer incomer circuit breaker CB1 can trigger. The current threshold is given in xIn and the vertical axis on the graphs of FIG. 6 is expressed in pu (per unit) where In=1 pu.

On the contrary, the second transformer incomer circuit breaker CB2 does not trigger because the second ANSI 67 protection $58_2$ does not detect any fault in phase A (67a at value 0 in graph 6(g)). In fact, the phase A has a high current amplitude 204, but the phase angle 206 is not in the forward direction. As a result, the second transformer incomer circuit breaker CB2 does not trigger.

Figure 7:
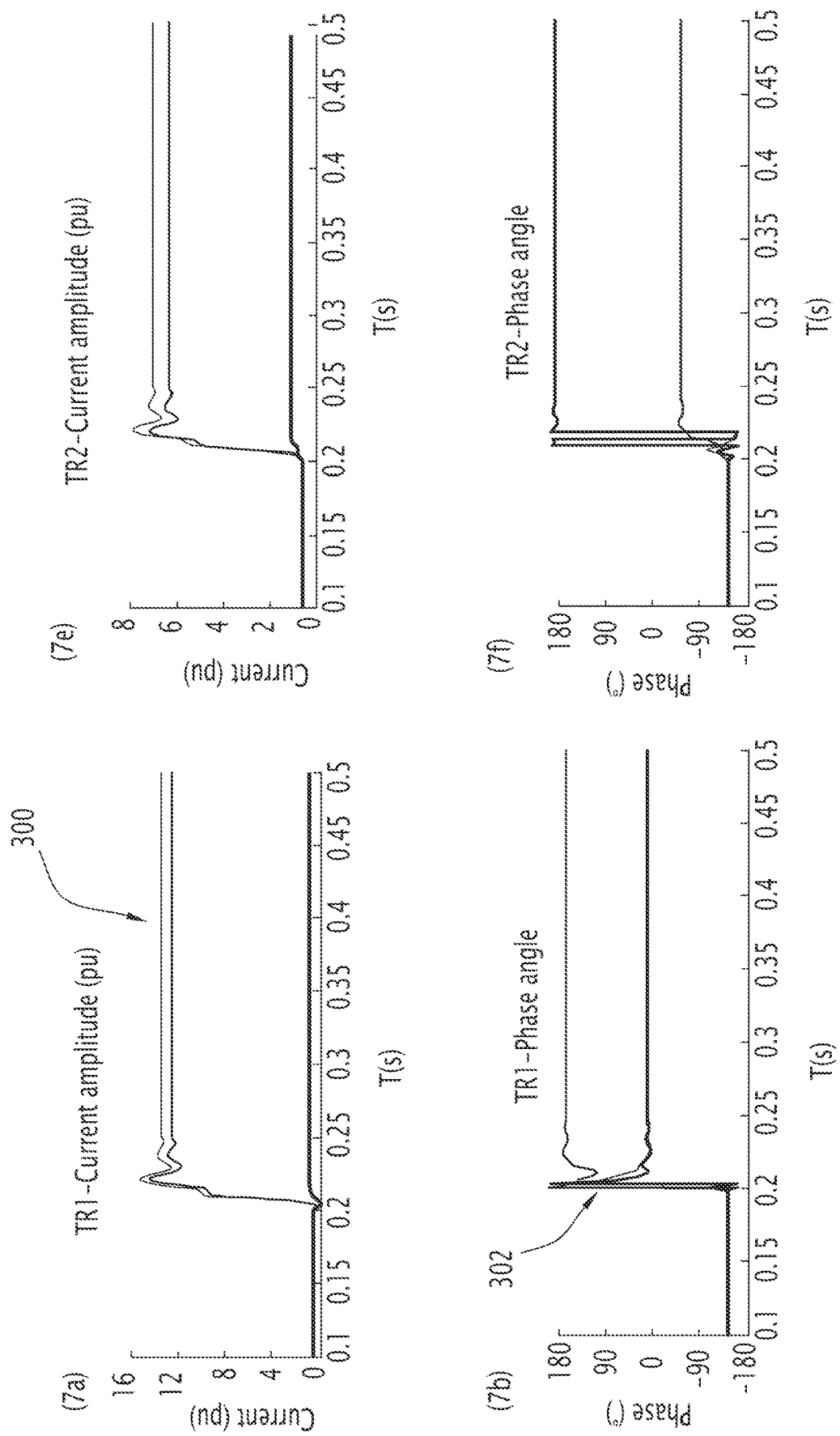
FIG. 7 shows graphs of the current, the phase, the input signals and the ratio signals of the circuit of FIG. 5 during a two-phase fault at the first transformer.
Figure 7:
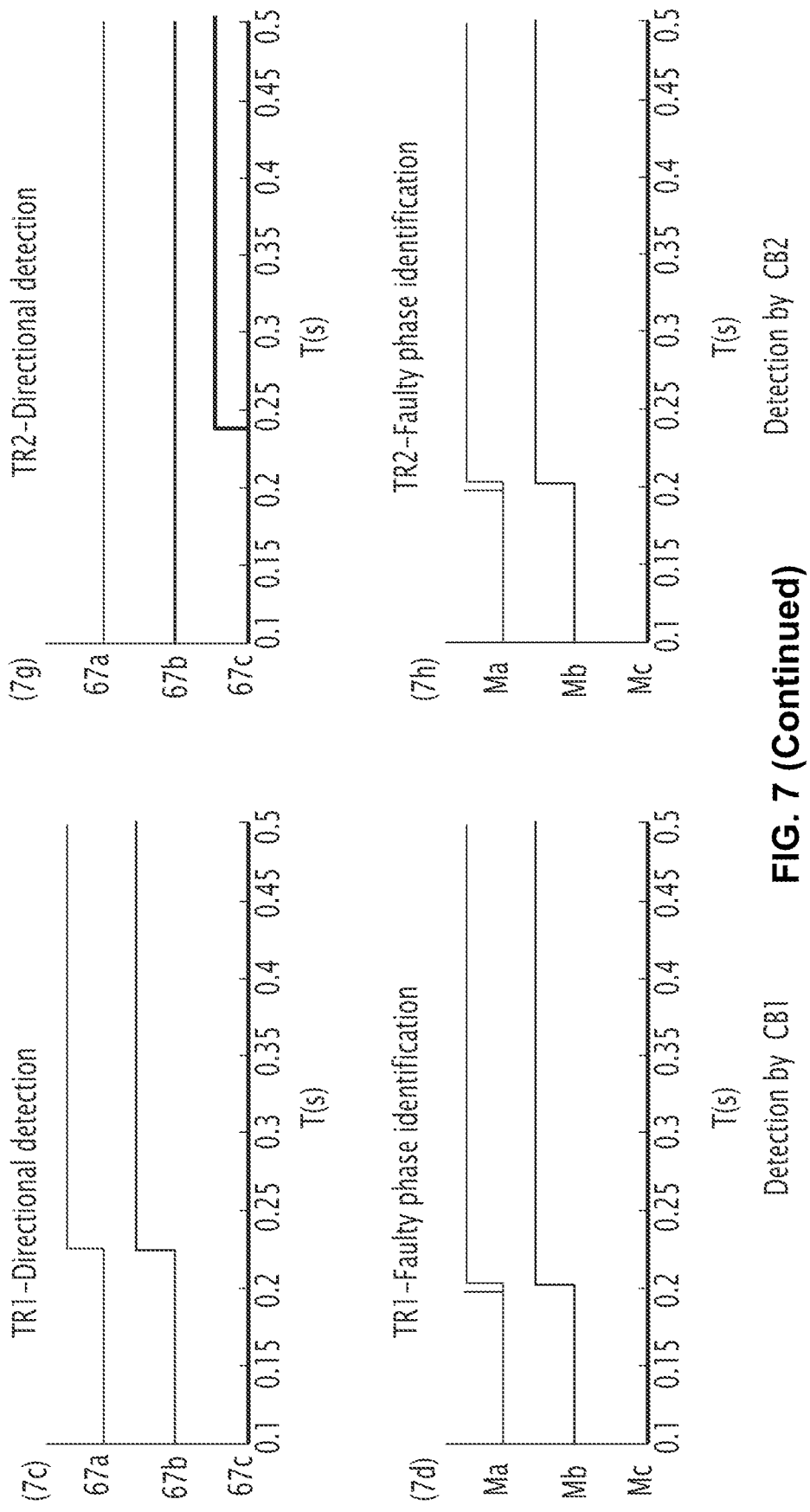

FIG. 7 shows graphs of the current, the phase, the input signals and the ratio signals of the circuit of FIG. 5 during a two-phase fault at the first transformer.

In this example, the first ANSI 67 protection $58_1$ detects, with the "two out of three" rule, a fault in phase A and B (67a and 67b at value 1 in graph 7(c)), as their current amplitude 300 exceeds the threshold and the phase angle 302 gets into forward direction. The Ma and Mb signals equal to 1 in graph 7(d) confirm that the phases A and B are the faulty phases, so the first transformer incomer circuit breakers CB1 can trigger.

The second ANSI 67 protection $58_2$ detects a fault in phase C in the forward direction ($67c$ at value 1 in graph $7(g)$).

If a trigger decision would only be based on a current threshold and a direction detection, the second transformer incomer circuit breakers CB2 would trigger unexpectedly. This would lead to the disconnection of the two transformers $52_1$, $52_2$ and a blackout of the installation.

According to the method of the present invention, the Mc signal equal to 0 in graph $7(h)$ indicates that there is no fault in phase C, thus avoiding a wrong trigger of the second transformer incomer circuit breaker CB2.

Clearly, the principle of the invention remaining the same, the embodiments and the details of production can be varied considerably from what has been described and illustrated purely by way of non-limiting example, without departing from the scope of protection of the present invention as defined by the attached claims.

The invention claimed is:

1. A method for detecting faults in a low voltage three-phase network, comprising:
providing, as a voltage or current input signal, by a directional overcurrent protection device for the three-phase network, a directional detection result for each phase of the three-phase network, each directional detection result indicating a current magnitude and a current direction for a respective phase of the three-phase network, the directional detection result for each phase of the three-phase network being provided to a control unit of the directional overcurrent protection device;
determining, at the control unit, using the directional detection result for each phase of the three-phase network, that one or more phases of the three-phase network satisfies first conditions;
determining, at a second logic block of the control unit, using the directional detection result signal for each phase of the three-phase network, that at least two of the phases satisfy the first conditions, and detecting, at the second logic block, an inter-phase fault by detecting that the current magnitude in the at least two phases exceed a threshold and that the corresponding current flows are in the same direction;
determining, at a first logic block of the control unit, that only one of the three phases satisfies the first conditions, and for the phase which has satisfied the first conditions, determining, at downstream parallel logic blocks of the control unit, that a second condition is satisfied and, detecting, at one or more further downstream logic blocks of the control unit, a mono-phase fault; and
generating an alarm signal at one or more further downstream logic blocks of the control unit upon detection of the mono-phase fault.

2. The method according to claim 1, wherein the first conditions are satisfied for any phase of the three-phase network if, for a predetermined time interval:
the magnitude of the current in the phase exceeds a preset value; and
the direction of the current in the phase is in a preset direction.

3. The method according to claim 1, wherein the second condition is satisfied if the following equations are satisfied:

$$Ma = \left( \frac{\sqrt{3} \cdot V_{AN}}{U_{BC}} < M_s \right)$$

$$Mb = \left( \frac{\sqrt{3} \cdot V_{BN}}{U_{CA}} < M_s \right)$$

$$Mc = \left( \frac{\sqrt{3} \cdot V_{CN}}{U_{AB}} < M_s \right)$$

wherein Ma, Mb, Mc refers to respective phases of the three-phases network, the signals $V_{AN}$, $V_{BN}$ and $V_{CN}$ are the phase-to-neutral voltages, $M_s$ is a preset value, and $U_{BC}$ is a reference voltage for the current in phase A, $U_{CA}$ is a reference voltage for the current in phase B, and $U_{AB}$ is a reference voltage for the current in phase C.

4. The method according to claim 3, wherein $M_s$ is comprised between 0 and 1.

5. The method according to claim 2, wherein the direction of the current for a phase is determined based on a phase angle between the current for the phase and a reference voltage.

6. The method according to claim 5, wherein the reference voltage is a quadrature phase-to-phase voltage.

7. The method according to claim 1, further comprising checking if the neutral of the network is present and, in a positive case, generating the alarm signal.

8. A phase directional overcurrent system for a low voltage three-phase network, the system comprising:
a control unit; and
a plurality of logic blocks within the control unit;
wherein the control unit and/or the plurality of logic blocks are configured to perform the following:
determine three input signals representing current magnitude and direction for each respective phase of the three-phase network;
determine, through the control unit, if first conditions are satisfied for any phase, and in a positive case, put a corresponding input signal for the phase at a value 1, otherwise at a value 0;
send, through the control unit, the input signals in parallel to a first mono-phase logic block and to an inter-phase logic block;
detect, through the inter-phase logic block, if at least two of the input signals has a value equal to 1, and in a positive case, output, from the first mono-phase logic block, a first intermediate signal equal to 0 to indicate detection of an inter-phase fault;
determine, through the first mono-phase logic block, if any of the input signals has a value equal to 1, and in a positive case, output, from the first mono-phase logic block, a first intermediate signal equal to 1;
send, through the first mono-phase logic block, the first intermediate signal to first AND logic blocks, each first AND logic block also receiving a respective input signal and a respective ratio signal, said respective ratio signal corresponding to a second condition;
check, through a corresponding first AND logic block, for any input signal which has a value equal to 1, if also the respective ratio signal has a value equal to 1 and, in a positive case, output a second intermediate signal with value equal to 1;
output, through a second mono-phase logic block, connected to the first AND logic blocks, a third intermediate signal having a value equal to 1 if only one second intermediate signal has a value equal to 1; and check, through a second AND logic block, if the third intermediate signal is equal to 1 and if a neutral signal is also equal to 1, said neutral signal indicating that the neutral is present, and in a positive case, generating an alarm signal.

9. The phase directional overcurrent system according to claim 8, wherein when the at least two of the input signals has a value equal to 1, the inter-phase logic block applies a "two out of three" condition to detect an inter-phase fault and outputs an output signal representative of such inter-phase detected fault.

10. The phase directional overcurrent system according to claim 9, wherein said output signal is sent through the inter-phase logic block to an OR block together with the alarm signal.

* * * * *